United States Patent
Park

(10) Patent No.: US 8,059,439 B2
(45) Date of Patent: Nov. 15, 2011

(54) ENCODING DATA FOR STORAGE IN A CONTENT ADDRESSABLE MEMORY

(75) Inventor: Kee Park, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 13/169,682

(22) Filed: Jun. 27, 2011

(65) Prior Publication Data

US 2011/0255322 A1     Oct. 20, 2011

Related U.S. Application Data

(62) Division of application No. 12/709,404, filed on Feb. 19, 2010, now Pat. No. 8,023,298.

(51) Int. Cl.
*G11C 15/00* (2006.01)
(52) U.S. Cl. .................. 365/49.1; 365/49.17; 365/49.18
(58) Field of Classification Search .................. 365/49.1, 365/19.17, 49.18
See application file for complete search history.

(56) References Cited

U.S. PATENT DOCUMENTS

| 5,319,590 | A  | 6/1994  | Montoye |
| 6,560,156 | B2 | 5/2003  | Lien et al. |
| 6,700,827 | B2 | 3/2004  | Lien et al. |
| 6,721,202 | B1 | 4/2004  | Roge et al. |
| 6,865,098 | B1 | 3/2005  | Ichiriu et al. |
| 7,133,302 | B1 | 11/2006 | Srinivasan et al. |
| 7,848,129 | B1 * | 12/2010 | Deshpande et al. ....... 365/49.17 |

* cited by examiner

*Primary Examiner* — Jason Lappas
(74) *Attorney, Agent, or Firm* — Mahamedi Paradice Kreisman LLP; William L. Paradice, III

(57) ABSTRACT

An encoding scheme is disclosed that allows a CAM device to selectively store, within each cell of a row of the CAM device, either a single bit of a binary value or two bits of an encoded data word encoded from the binary value. By storing two bits of the encoded data word in each CAM cell, data may be stored more efficiently and CAM systems may consume less power. The encoded data words can be balanced data words that have equal number of logic high and logic low values.

25 Claims, 16 Drawing Sheets

| X | Y | Data value |
|---|---|---|
| 0 | 0 | Don't care |
| 0 | 1 | 1 |
| 1 | 0 | 0 |
| 1 | 1 | invalid |

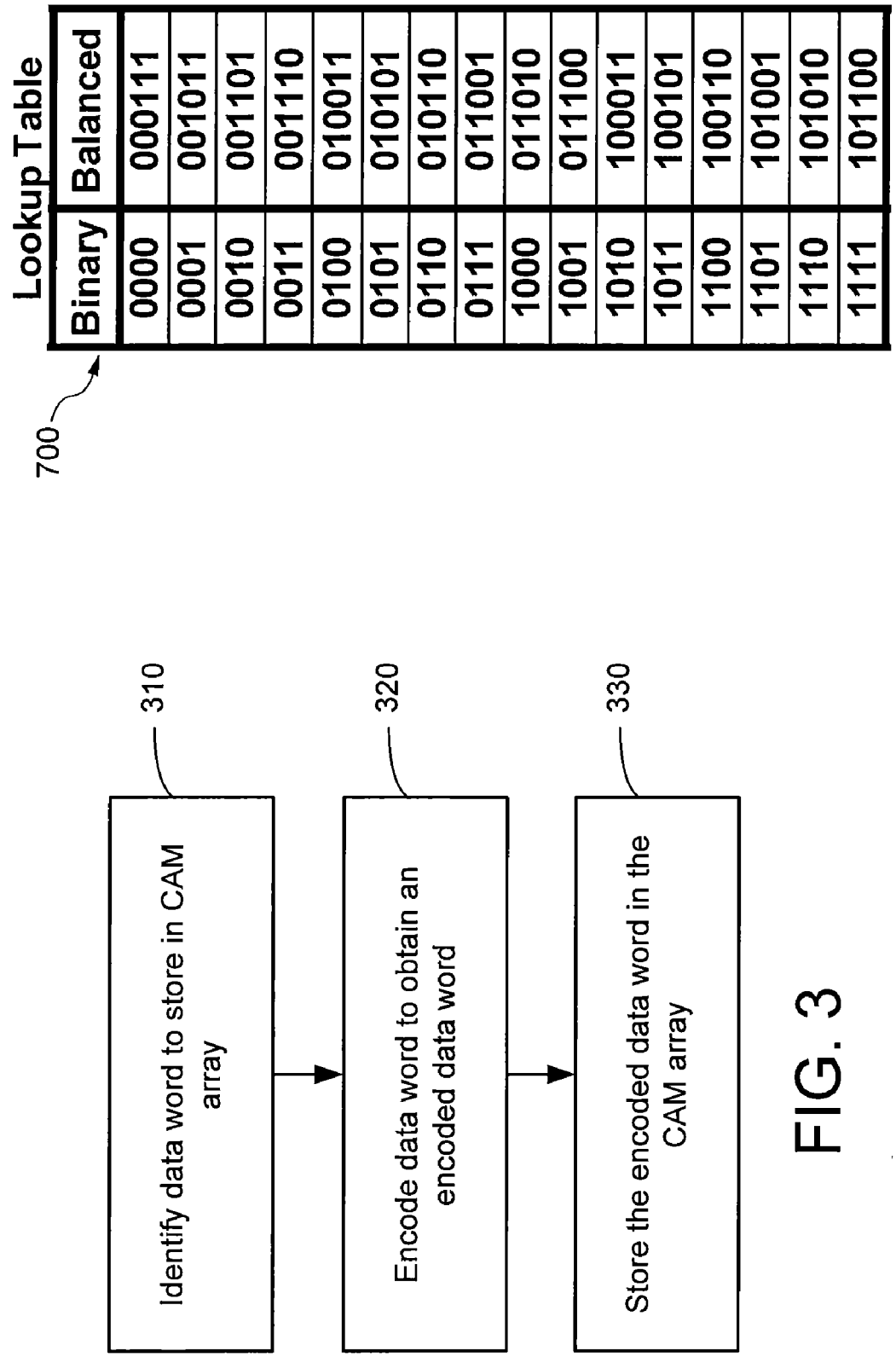

400

| T | S | N | T | S | N | T | S | N | T | S | N |
|---|---|---|---|---|---|---|---|---|---|---|---|
| 1 | 2 | 1 | 21 | 5.38E+11 | 38 | 41 | 4.25E+23 | 78 | 61 | 3.83E+35 | 118 |
| 2 | 6 | 2 | 22 | 2.1E+12 | 40 | 42 | 1.68E+24 | 80 | 62 | 1.52E+36 | 120 |
| 3 | 20 | 4 | 23 | 8.23E+12 | 42 | 43 | 6.64E+24 | 82 | 63 | 6.03E+36 | 122 |
| 4 | 70 | 6 | 24 | 3.22E+13 | 44 | 44 | 2.62E+25 | 84 | 64 | 2.4E+37 | 124 |
| 5 | 252 | 7 | 25 | 1.26E+14 | 46 | 45 | 1.04E+26 | 86 | 65 | 9.51E+37 | 126 |
| 6 | 924 | 9 | 26 | 4.96E+14 | 48 | 46 | 4.11E+26 | 88 | 66 | 3.77E+38 | 128 |
| 7 | 3432 | 11 | 27 | 1.95E+15 | 50 | 47 | 1.63E+27 | 90 | 67 | 1.5E+39 | 130 |
| 8 | 12870 | 13 | 28 | 7.65E+15 | 52 | 48 | 6.44E+27 | 92 | 68 | 5.95E+39 | 132 |
| 9 | 48620 | 15 | 29 | 3.01E+16 | 54 | 49 | 2.55E+28 | 94 | 69 | 2.36E+40 | 134 |
| 10 | 184756 | 17 | 30 | 1.18E+17 | 56 | 50 | 1.01E+29 | 96 | 70 | 9.38E+40 | 136 |
| 11 | 705432 | 19 | 31 | 4.65E+17 | 58 | 51 | 4E+29 | 98 | 71 | 3.73E+41 | 138 |
| 12 | 2704156 | 21 | 32 | 1.83E+18 | 60 | 52 | 1.58E+30 | 100 | 72 | 1.48E+42 | 140 |
| 13 | 10400600 | 23 | 33 | 7.22E+18 | 62 | 53 | 6.27E+30 | 102 | 73 | 5.88E+42 | 142 |
| 14 | 40116600 | 25 | 34 | 2.85E+19 | 64 | 54 | 2.49E+31 | 104 | 74 | 2.34E+43 | 144 |
| 15 | 1.55E+08 | 27 | 35 | 1.12E+20 | 66 | 55 | 9.85E+31 | 106 | 75 | 9.28E+43 | 146 |
| 16 | 6.01E+08 | 29 | 36 | 4.43E+20 | 68 | 56 | 3.91E+32 | 108 | 76 | 3.69E+44 | 148 |
| 17 | 2.33E+09 | 31 | 37 | 1.75E+21 | 70 | 57 | 1.55E+33 | 110 | 77 | 1.47E+45 | 150 |
| 18 | 9.08E+09 | 33 | 38 | 6.89E+21 | 72 | 58 | 6.14E+33 | 112 | 78 | 5.83E+45 | 152 |
| 19 | 3.53E+10 | 35 | 39 | 2.72E+22 | 74 | 59 | 2.44E+34 | 114 | 79 | 2.32E+46 | 154 |
| 20 | 1.38E+11 | 37 | 40 | 1.08E+23 | 76 | 60 | 9.66E+34 | 116 | 80 | 9.2E+46 | 156 |

FIG. 4

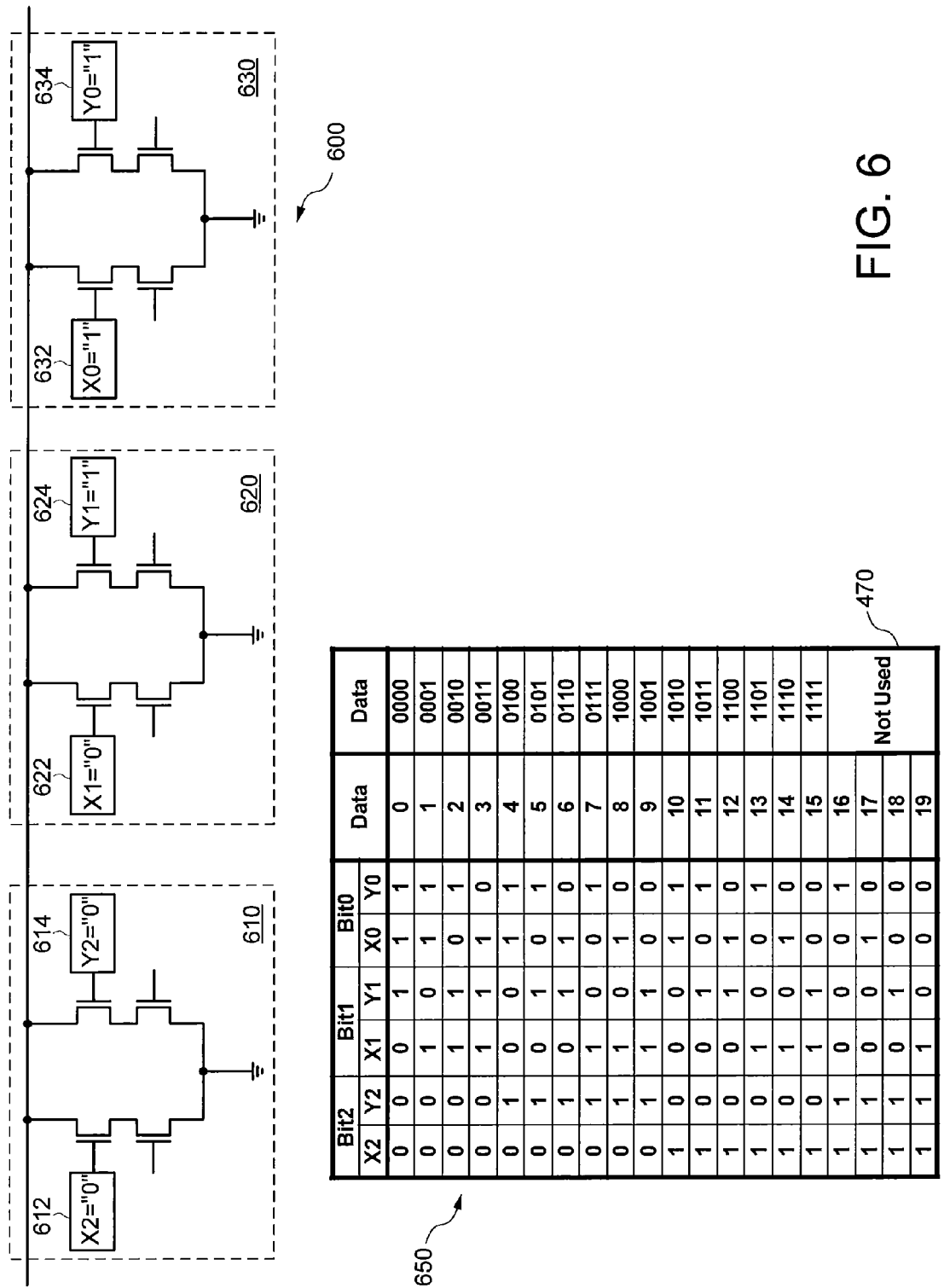

| T | N | K | T | N | K | T | N | N | T | N | K |
|---|---|---|---|---|---|---|---|---|---|---|---|
| 1 | 1 | X | 21 | 38 | 34 | 41 | 78 | 72 | 61 | 118 | 112 |
| 2 | 2 | 2 | 22 | 40 | 36 | 42 | 80 | 74 | 62 | 120 | 114 |
| 3 | 4 | 2 | 23 | 42 | 38 | 43 | 82 | 76 | 63 | 122 | 116 |
| 4 | 6 | 6 | 24 | 44 | 40 | 44 | 84 | 78 | 64 | 124 | 118 |
| 5 | 7 | 4 | 25 | 46 | 42 | 45 | 86 | 80 | 65 | 126 | 120 |
| 6 | 9 | 6 | 26 | 48 | 44 | 46 | 88 | 82 | 66 | 128 | 122 |
| 7 | 11 | 8 | 27 | 50 | 46 | 47 | 90 | 84 | 67 | 130 | 124 |
| 8 | 13 | 10 | 28 | 52 | 48 | 48 | 92 | 86 | 68 | 132 | 126 |
| 9 | 15 | 12 | 29 | 54 | 50 | 49 | 94 | 88 | 69 | 134 | 128 |
| 10 | 17 | 14 | 30 | 56 | 52 | 50 | 96 | 90 | 70 | 136 | 130 |
| 11 | 19 | 16 | 31 | 58 | 54 | 51 | 98 | 92 | 71 | 138 | 132 |
| 12 | 21 | 18 | 32 | 60 | 56 | 52 | 100 | 94 | 72 | 140 | 134 |
| 13 | 23 | 20 | 33 | 62 | 58 | 53 | 102 | 96 | 73 | 142 | 136 |
| 14 | 25 | 20 | 34 | 64 | 60 | 54 | 104 | 98 | 74 | 144 | 138 |
| 15 | 27 | 22 | 35 | 66 | 62 | 55 | 106 | 100 | 75 | 146 | 140 |
| 16 | 29 | 24 | 36 | 68 | 64 | 56 | 108 | 102 | 76 | 148 | 142 |
| 17 | 31 | 26 | 37 | 70 | 66 | 57 | 110 | 104 | 77 | 150 | 144 |
| 18 | 33 | 28 | 38 | 72 | 68 | 58 | 112 | 106 | 78 | 152 | 146 |
| 19 | 35 | 30 | 39 | 74 | 70 | 59 | 114 | 108 | 79 | 154 | 148 |
| 20 | 37 | 32 | 40 | 76 | 70 | 60 | 116 | 110 | 80 | 156 | 150 |

FIG. 9

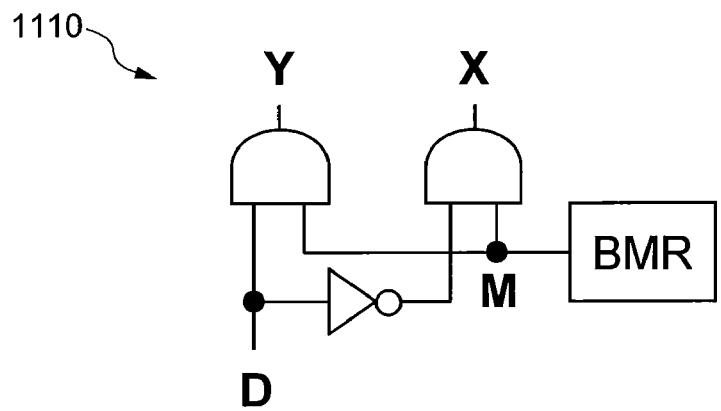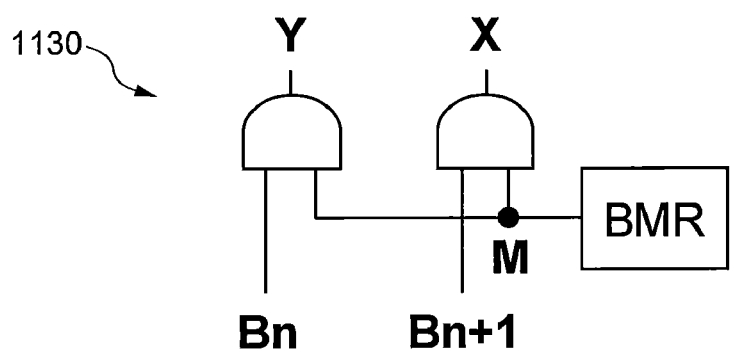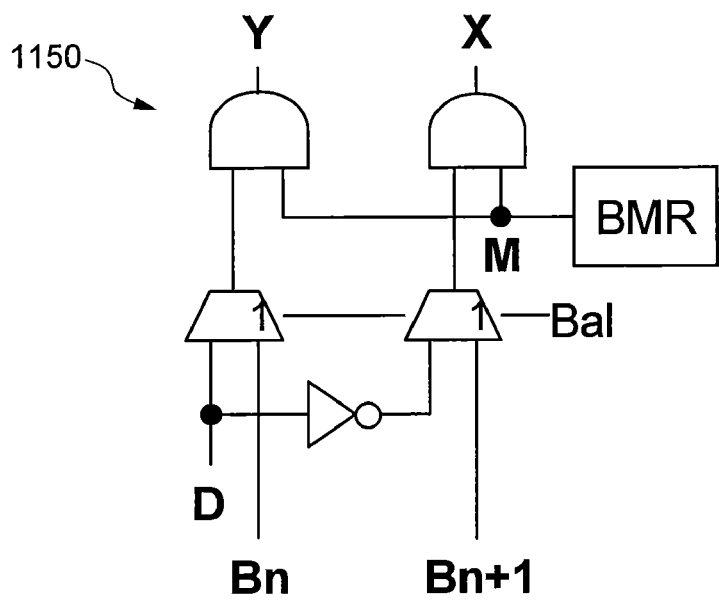
FIG. 11

ENCODING DATA FOR STORAGE IN A CONTENT ADDRESSABLE MEMORY

CROSS-REFERENCE TO RELATED APPLICATIONS

This application is a divisional, and claims the benefit under 35 USC 120, of the commonly owned U.S. patent application Ser. No. 12/709,404 entitled "Encoding Data For Storage In A Content Addressable Memory" filed on Feb. 19, 2010, now U.S. Pat. No. 8,023,298 which is incorporated by reference herein.

TECHNICAL FIELD

The present embodiments generally relate to content addressable memory (CAM) devices, and more particularly to CAM devices having cells which may selectively store either a single bit of a data word or two bits of an encoded data word.

BACKGROUND

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding address) stored in an array within the CAM device. If there is a matching entry stored in the CAM array, the index of the matching CAM word can be used to access a corresponding location in an associated memory device to retrieve a destination address and/or other routing information for the packet.

A CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

CAM arrays typically include either binary CAM cells that store binary data values (i.e., a logic "1" or a logic "0" value) or ternary CAM cells that store ternary data values (i.e., a logic "1" value, a logic "0" values, or a don't care value). Ternary CAM cells store a data bit and a mask bit. For example, when a mask bit within a ternary CAM cell is inactive (e.g., set to a logic 1 value), the ternary CAM cell operates as a conventional binary CAM cell storing an "unmasked" data bit. When the mask bit is active (e.g., set to a logic 0 value), the ternary CAM cell is treated as storing a "don't care" value, which means that all compare operations performed on the actively masked ternary CAM cell will result in a cell match condition.

FIG. 1A shows a well-known quaternary CAM cell 100 of the type described in U.S. Pat. No. 5,319,590 issued to Montoye, the disclosure of which is incorporated herein by reference. Quaternary CAM cells, which are also referred to as XY CAM cells, include two storage cells 120 and 122 coupled to a compare circuit 130. The two data bits X and Y can collectively represent four possible states: "0", "1", "don't care", and a fourth state which may be left unused or may indicate "invalid," as depicted in FIG. 1B. The logic "0" and "1" states correspond to the logic states represented, for example, by a conventional binary CAM cell. For each of these states, if the comparand data (e.g., provided to CAM cell 100 via complementary comparand lines CL and CLB) matches the data stored in CAM cell 100, compare circuit 130 does not discharge the match line ML, which indicates a match condition. Conversely, if the comparand data does not match the data stored in CAM cell 100, compare circuit 130 discharges ML (e.g., toward ground potential) to indicate the mismatch condition. For the "don't care" state, the logic low values for X and Y maintain respective transistors 132 and 134 in non-conductive states, thereby preventing compare circuit 130 from discharging ML. In this manner, data stored in CAM cell 100 is masked from the compare operation, thereby forcing a match condition for CAM cell 100, regardless of the comparand data. For the "invalid" state, the logic high values for X and Y maintain respective transistors 132 and 134 in conductive states. During a compare operation, one of the complementary comparand data bit pair provided on CL/CLB will be logic high, thereby causing compare circuit 130 to discharge ML to indicate the mismatch state. In this manner, data stored in CAM cell 100 forces a mismatch condition, regardless of the comparand data, and is therefore not normally used.

Note that the XY CAM cell 100 stores a data value as a complimentary bit pair, where the Y bit stores the binary value and the X bit stores the complemented binary value. This allows XY CAM cell 100 to perform faster compare operations than conventional binary and ternary CAM cells. However, because only three of the four possible states represented by XY CAM cell 100 are used, data storage capacity is not fully utilized. Thus, it would be desirable to utilize all four of the possible quaternary states to maximize data storage density.

BRIEF DESCRIPTION OF THE DRAWINGS

Present embodiments are illustrated by way of example, and not by way of limitation, in the figures of the accompanying drawings and in which like reference numerals refer to similar elements and in which:

FIG. 3 is a flowchart illustrating the high level functional steps performed by the programmable read/write circuit in storing an encoded data word in a CAM array according to an embodiment;

FIG. 4 is a table that depicts, for various sizes of CAM rows according to an embodiment, the number of balanced binary words which are possible and the equivalent binary data width according to prior encoding schemes;

FIG. 6 is an illustration of CAM row comprising three XY CAM cells that store data in an encoding scheme according to an embodiment;

FIG. 7 is a depiction of a lookup table which may be used to encode a data word into an encoded data word according to an illustrative embodiment;

FIG. 9 is a table that illustrates the compression rate that encoded data words are able to achieve using the Knuth algorithm according to embodiments;

FIG. 11 is an illustration of several approaches for implementing a column driver according to an embodiment;

DETAILED DESCRIPTION

A data encoding scheme is disclosed that allows each CAM cell in a row of a CAM device to selectively store either a single bit of a data word or two bits of an encoded data word. By storing encoded data according to present embodiments, data storage density of CAM devices can be increased and power consumption can be reduced (e.g., as compared to storing un-encoded data). In the following description, numerous specific details are set forth in order to provide a thorough understanding of the present embodiments. It will be apparent, however, that the present embodiments may be practiced without these specific details. In other instances, well-known structures and devices are shown in block diagram form in order to avoid unnecessarily obscuring the exemplary embodiments described herein.

More specifically, present embodiments employ a data encoding scheme that allows an array of XY CAM cells to store larger amounts of information by utilizing all four possible states of the XY CAM cells. For some embodiments, the CAM device data encoding circuits that can be configured to selectively store either a single bit of a data word or two bits of an encoded data word within each XY CAM. For some embodiments, the encoded data word can be expressed as a balanced binary word.

For example, a CAM row including 3 XY CAM cells can store a 6-bit encoded data word created in accordance with present embodiments. The 6-bit encoded data word can represent more than 16 different binary values, as explained in detail below. In contrast, for conventional approaches in which each XY CAM cell stores a single data bit, at least $\log_2 16=4$ CAM cells are required to store the same amount of information (e.g., 16 possible states). Thus, for this example, storing encoded data in the CAM cells results in a 33% increase in data storage capacity. Further, for this example, power consumption attributed to the match lines and bit lines is reduced by 25% because compare data needs to be switched on only 3 comparand lines instead of on 4 comparand lines.

Figures 1A, 1B:
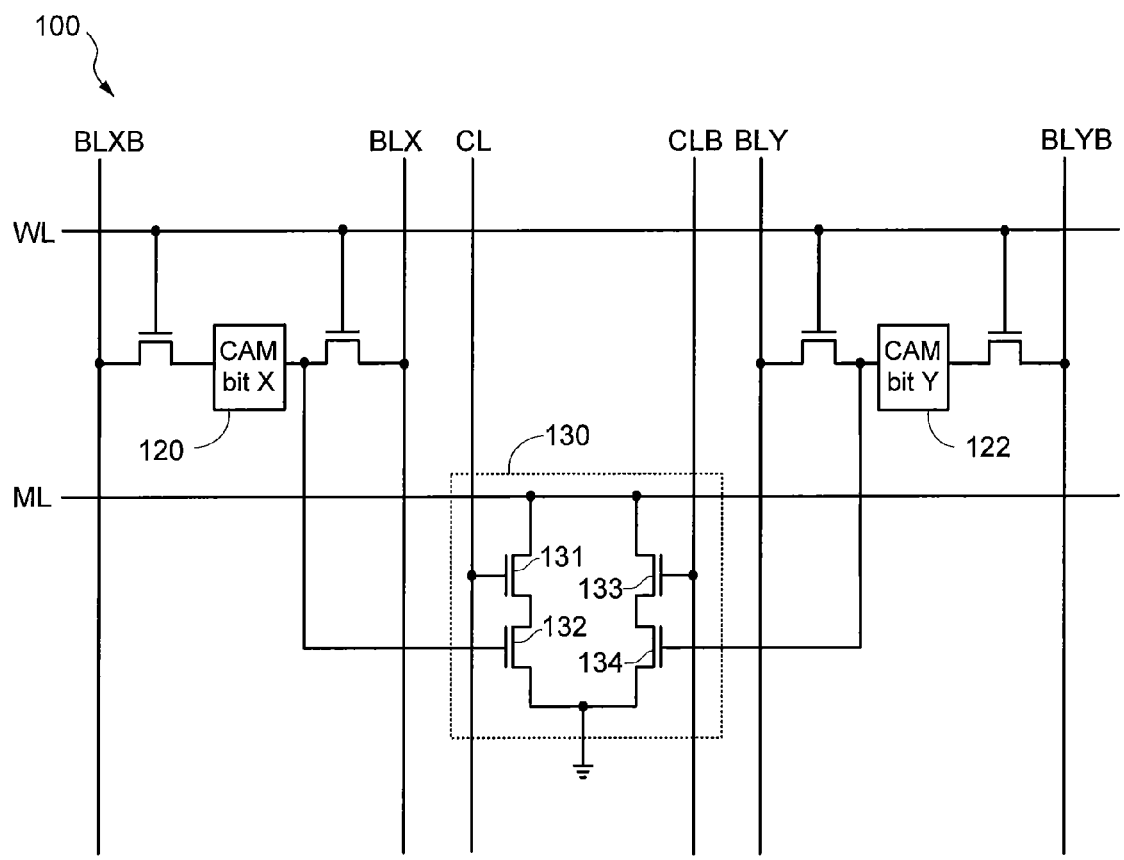
FIG. 1A is circuit diagram of a conventional quaternary (XY) CAM cell.
FIG. 1B shows a truth table for conventional data storage of the XY CAM cell of FIG. 1A.
Figure 2A:
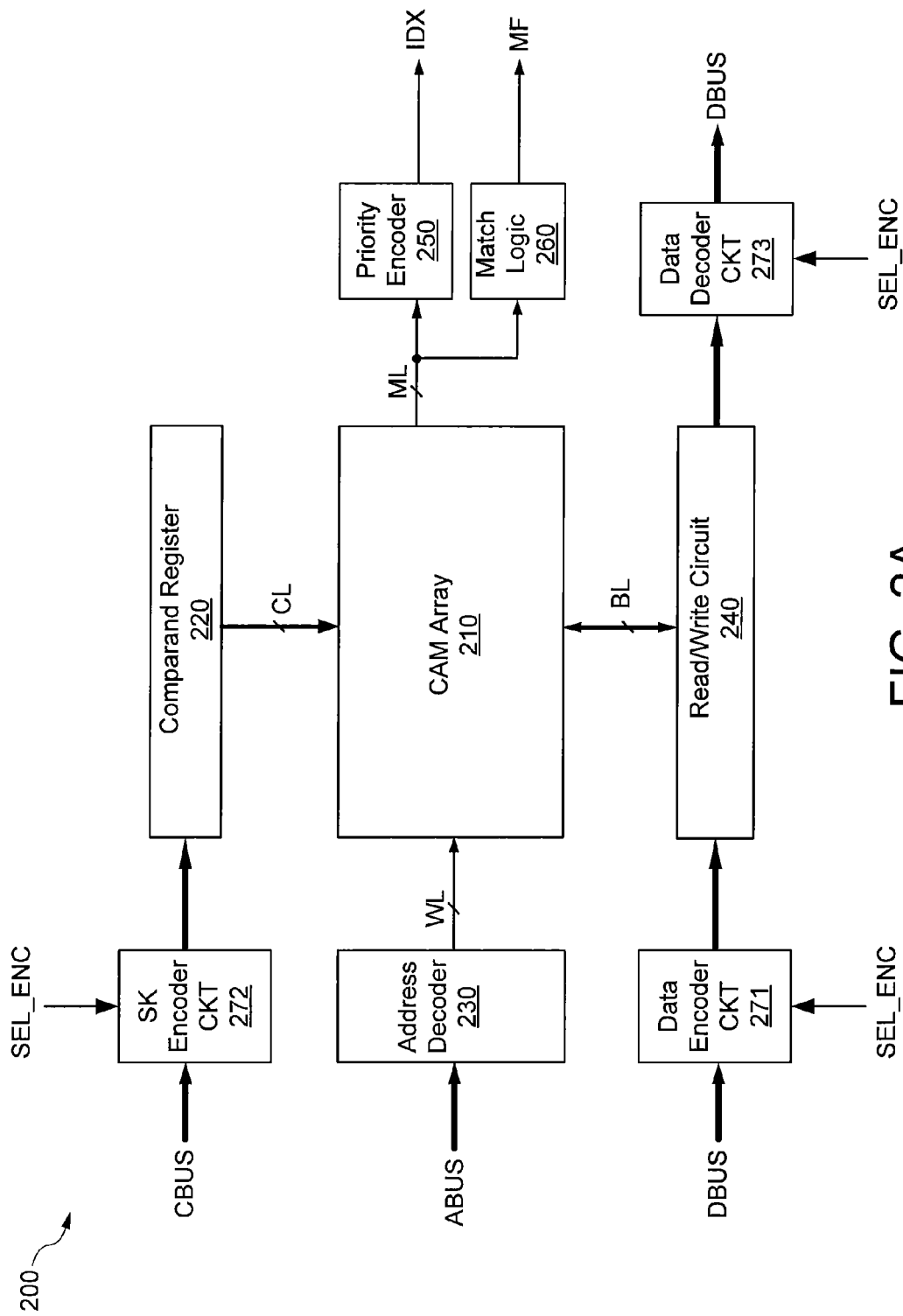
FIG. 2A is a block diagram of a CAM device according to one embodiment.

FIG. 2A is a block diagram of a CAM device 200 in accordance with present embodiments. CAM device 200 includes a CAM array 210, a comparand register 220, an address decoder 230, a read/write circuit 240, a priority encoder circuit 250, match logic 260, a data encoder circuit 271, a search key encoder circuit 272, and a data decoder circuit 273. CAM array 210 includes any number of rows of CAM cells (not shown in FIG. 2A), which for exemplary embodiments described herein are XY CAM cells of the type shown in FIG. 1A. For other embodiments, CAM array 210 can also include other types of CAM cells such as binary or ternary CAM cells. While CAM array 210 is shown in FIG. 2A as a single CAM array, it can include any number of CAM array blocks that can be independently searched.

One or more instructions and related control signals may be provided to CAM device 200 from an instruction decoder (not shown for simplicity) to control read, write, compare, and other operations for CAM device 200. Other well-known signals which can be provided to CAM device 200, such as enable signals, clock signals, and power connections, are also not shown for simplicity. Further, although not shown in FIG. 2A, each row of CAM cells in CAM array 210 can have one or more validity bits to indicate whether the corresponding row (or any segment thereof) of CAM cells stores valid data. In addition, for some embodiments, the rows in CAM array 210 can be divided into a plurality of row segments, for example, to reduce the capacitive loading for each row or to provide multiple width/depth configurations for the array.

Each row of CAM cells (not shown for simplicity) in CAM array 210 is coupled to well-known address decoder 230 via a corresponding word line WL, and to a well-known priority encoder 250 and to well-known match logic 260 via a corresponding match line ML. For simplicity, the word lines and match lines are represented collectively in FIG. 2A. The match lines ML provide match results for compare operations between comparand data (e.g., a search word or search key) and data stored in CAM array 210 to priority encoder 250. In response thereto, priority encoder 250 determines the matching entry that has the highest priority number associated with it and generates the index (IDX) or address of this highest priority match (HPM). In addition, priority encoder 250 may use the validity bits from CAM array 210 to generate the next free address (NFA) that is available in CAM array 210 for storing new data. Although not shown in FIG. 2A, for some embodiments, priority encoder 250 may provide the NFA to address decoder 230.

Each column of CAM cells (not shown for simplicity) in CAM array 210 is coupled to comparand register 220 via one or more corresponding comparand lines CL, and is coupled to read/write circuit 240 via one or more corresponding bit lines BL. For simplicity, the comparand lines CL and bit lines BL are represented collectively in FIG. 2A. Comparand register 220 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes write drivers to write data received from a data bus DBUS to CAM array 210, and includes sense amplifiers to read data from CAM array 210 onto DBUS. For other embodiments, read/write circuit 210 may be coupled to a bus other than DBUS. Further, although not shown in FIG. 2A for simplicity, CAM device 200 can include a well-known global mask circuit (e.g., coupled to the comparand register 220) that can selectively mask the bits of the search key provided to the CAM array 210.

Data encoder circuit 271 includes an input coupled to DBUS, an output coupled to read/write circuit 240, and a control terminal to receive a select encoding signal (SEL_ENC). In response to SEL_ENC, data encoder circuit 271 selectively encodes a data word received from DBUS using a selected one of a number of different encoding schemes to create an encoded data word to be written into CAM array 210 by read/write circuit 240. Search key encoder circuit 272 includes an input coupled to CBUS, an output coupled to comparand register 220, and a control terminal to receive SEL_ENC. In response to SEL_ENC, search key encoder circuit 272 selectively encodes a search key received from CBUS using the selected encoding scheme to create an encoded search key to be provided to CAM array 210 by comparand register 220 for search operations with encoded data words stored in CAM array 210. In this manner, the search key and data words stored in CAM array 210 are encoded using the same selected encoding scheme. For other embodiments, data encoder circuit 271 and search key encoder circuit 272 can be the same circuit.

Data decoder circuit 273 includes an input coupled to read/write circuit 240, an output coupled to DBUS, and a control terminal to receive SEL_ENC. In response to SEL_ENC, data decoder circuit 273 selectively decodes an encoded data word read from CAM array 210 by read/write circuit 240. In this manner, data decoder circuit 273 converts encoded data stored in CAM array 210 back into the format (e.g., binary values) in which they were originally received by CAM device 200.

Figure 2B:
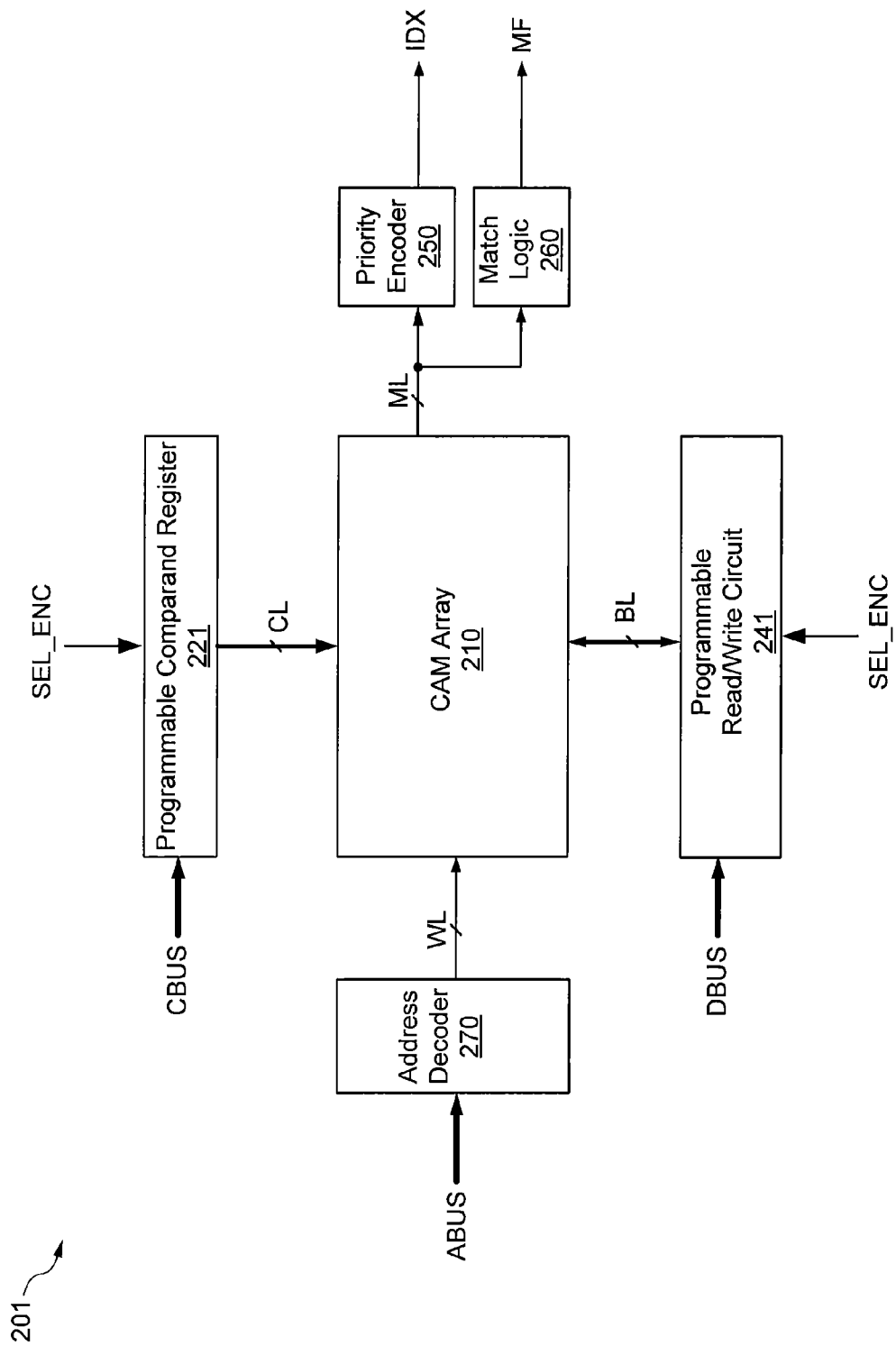
FIG. 2B is a block diagram of a CAM device according to one embodiment.

FIG. 2B is a block diagram of a CAM device 201 in accordance with other embodiments. CAM device 201 is similar to CAM device 200 of FIG. 2A, except that CAM device 201 includes a programmable read/write circuit 241 and a programmable comparand register 221, wherein programmable read/write circuit 241 performs the functions of read/write circuit 240, data encoder circuit 271, and data decoder circuit 273, and programmable comparand register 221 performs the functions of comparand register 220 and search key encoder circuit 272.

FIG. 3 is a flowchart illustrating the creation and storage of an encoded data word in CAM array 210 according to present embodiments. First, a data word (e.g., a binary value) to be stored in the CAM array 210 is identified (310). Next, data encoder circuit 271 encodes the data word using a selected one of a plurality of encoding schemes to generate an encoded data word. For some embodiments, an encoding scheme may be selected that encodes the data word into a balanced data word, as described in more detail below.

Then, the encoded data word is stored in a row (or a portion) of CAM array 210. Two bits of the encoded data word may be stored in each XY CAM cell of CAM array 210. Although the number of bits in the encoded data word may be greater than the number of bits of the original data word, the number of CAM cells required to store the encoded data word may be less than the number of CAM cells required to store the original un-encoded original data word because two bits of the encoded data word may be stored in each CAM cell, whereas conventional approaches store only one binary value in each CAM cell.

For some embodiments, an encoding scheme is used that represents an encoded data word as a balanced binary word. The notion of a balanced binary word was initially advanced by Donald E. Knuth and discussed in "Efficient Balanced Code," by Donald E. Knuth, IEEE Transactions on Information Theory, Vol. IT-32, No. 1, January 1986, which is incorporated herein by reference. A binary word of length m may be called a balanced binary word if it contains exactly m/2 ones (logic high values) and m/2 zeros (logic low values). For example, the binary word 00001111 is balanced because it includes an equal number of logic high and logic low values. However, the binary word 00000000 is not balanced because it does not include an equal number of logic high and logic low values.

Another property of balanced binary words is that the positions of the logic high values (1s) in one balanced binary word will never be a subset of the positions of the logic high values in another balanced binary word. For example, the position of the logic high values in the binary number 00001000 is not balanced because, among other reasons, they are a subset of the position of the logic high values in 00001111. On the other hand, the binary number 101001 is not a subset of 111000, 101010, or 100101, and is therefore considered to be balanced.

FIG. 4 is a table 400 depicts storage capacities of embodiments that employ encoding schemes to generate and store balanced binary words in an array of XY CAM cells, where T represents the number of XY CAM cells in a row of CAM array 210, S represents the number of different balanced data words that can be stored in T CAM cells, and N represents the number of CAM cells needed to store an equivalent amount of un-encoded data (e.g., data stored according to the conventional approach shown in FIG. 1B). For some embodiments, the number of different balanced words possible given a number T of XY CAM cells may be expressed as $S=(2T)!/(T!)^2$, and the equivalent binary word data width may be expressed as $N=\text{Trunc}(\text{Log}_2 S)$.

For example, a CAM row including 80 CAM cells may store a 160-bit balanced data word that is capable of representing $9.2*10^{46}$ distinct values. To store the equivalent amount of data using the conventional approach of FIG. 1B, the size of the CAM row would need to be increased from 80 cells to 156 cells. As another example, as shown by FIG. 4, a CAM row including 3 CAM cells may store a 6-bit balanced data word that is capable of identifying 20 distinct values. To store the equivalent amount of data using prior approaches, the size of the CAM row would need to be increased from 3 cells to 4 cells. Thus, present embodiments may significantly increase the density of stored data, as compared to conventional approaches. In addition, by increasing the density of stored data, the number of comparisons that need to be performed is reduced, thereby also reducing the amount of power consumed by match lines and data lines of the CAM array.

Figure 5:
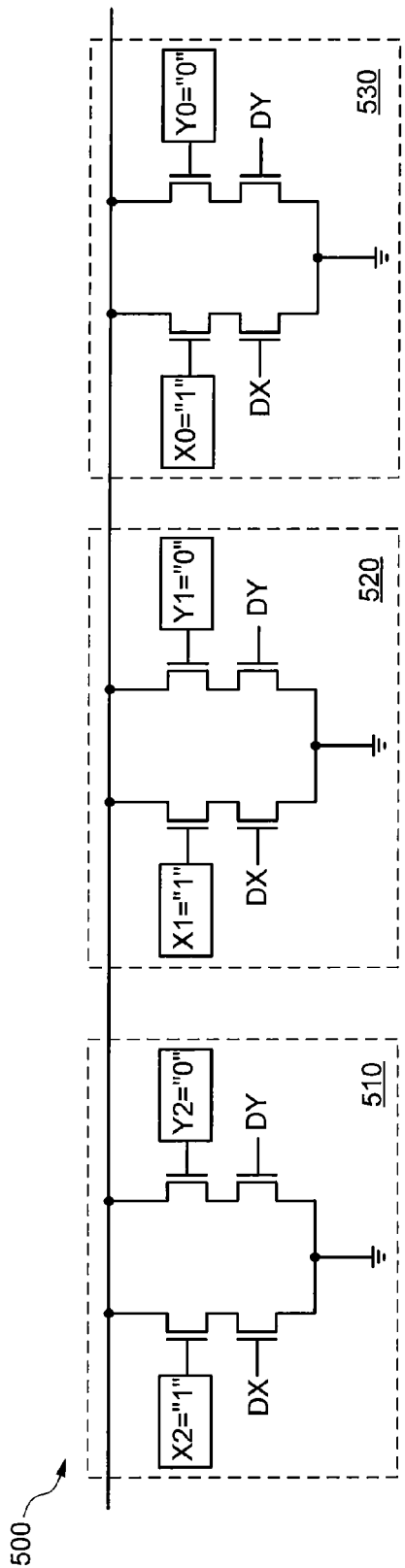
FIG. 5 is an illustration of a three bit CAM row for use in performing an exact match operation according to prior approaches.

FIG. 5 illustrates the storage of binary data in a row of XY CAM cells using conventional approaches. More specifically, FIG. 5 depicts the storage of the 3-bit binary value "000" in a CAM row 500 having 3 XY CAM cells 510, 520, and 530. As shown in FIG. 5, one bit of data is stored in complementary form in each of XY CAM cell 510, 520, and 530. As illustrated by table 550, three data bits can represent eight different binary values 560-567. The value of the data bit stored in CAM cell 510, 520, or 530 may be found by examining the value of the Y bit. Thus, in FIG. 5, CAM cells 510, 520, and 530 each store a logic 0. During compare operations, a bit of the search word and its compliment are provided to the compare circuits of each of CAM cells 510, 520, and 530 via the compare data lines labeled DX and DY, respectively. If the CAM cell does not discharge, then the value of the bit stored in the Y bit of the CAM cell matches the bit of the search word stored in the CAM cell.

Present embodiments provide an encoding scheme that enables a greater number of values to be represented by the same number of XY CAM cells as compared to the conventional approach illustrated in FIG. 5. FIG. 6 is an illustration of CAM row 600 comprising 3 XY CAM cells 610, 620, and 630 that store data in an encoding scheme according to some of the present embodiments. Using the encoding scheme of such embodiments, each of XY CAM cells 610, 620, and 630 store two bits of an encoded data word. In the example depicted by FIG. 6, the encoded data word stored by XY CAM cells 610, 620, and 630 is "000111," since X bit 612, Y bit 614, and X bit 622 each store a logic 0, while Y bit 624, X bit 632, and Y bit 634 each store a logic 1. As shown by table 650, the encoded data word 000111 corresponds to the data word 0000. Note that a four bit data word (0000) is able to be stored in CAM row 600, even though CAM row 600 only includes three CAM cells.

As shown by table 650, a six bit encoded data word can represent at least 16 different 4-bit balanced data words. Note that the last four states 470 depicted in table 450 are not needed to identify any of the 16 unique 4-bit states, and so they are not used by the embodiment depicted by FIG. 6.

Since CAM row 600 is able to store a six bit encoded data word that may represent any of the 16 unique 4-bit states (as shown by table 650), CAM row 600 is able to store any 4-bit binary value.

Present embodiments may use a variety of different encoding schemes to encode a data word into an encoded data word. In an embodiment, a lookup table may be used to translate 4-bit binary values into 6-bit balanced words, for example, as depicted by lookup table 700. The mapping between binary data words and encoded data words in lookup table 700 may be arbitrarily selected or selected to optimize performance. For example, both the binary data words and the encoded data words listed in table 700 may simply be listed in increasing order. As another example, the mappings may be based on minimizing power consumption within CAM device 200. A lookup table may also be used to translate an encoded data word into the original data word from which it was encoded. For example, using lookup table 700, one may determine that the 4-bit binary value 0100 corresponds to the 6-bit encoded data word 010011.

Other embodiments may employ other types of approaches for generating an encoded data word from a data word. For example, in an embodiment, a hash table may be used to translate a data word into an encoded data word or vice-versa. In another embodiment, an algorithm known as the Knuth algorithm may be used to translate a data word into an encoded data word or back again.

Figure 8:
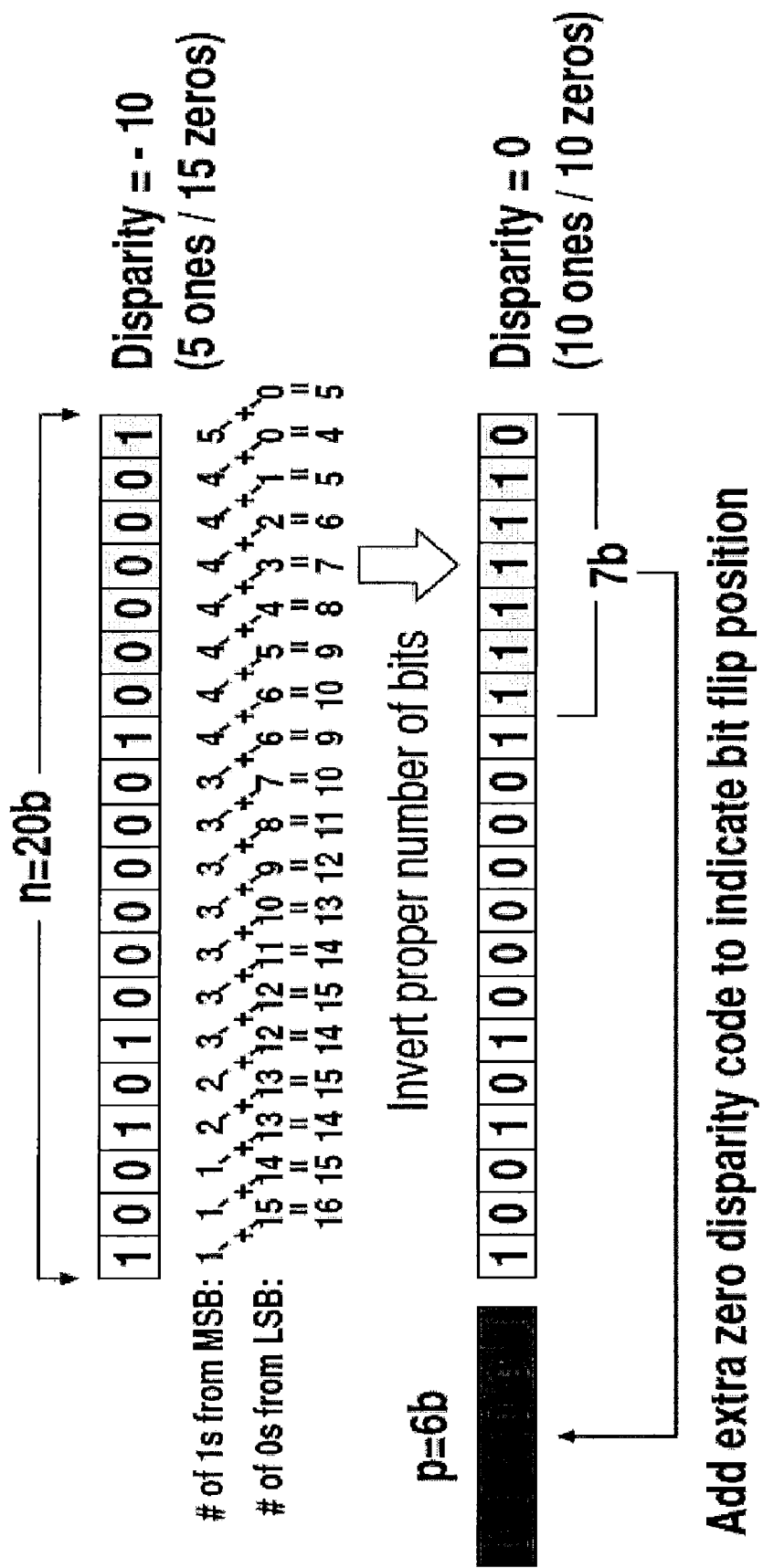
FIG. 8 is an illustration of the Knuth algorithm which may be used to encode a data word into an encoded data word by an embodiment.

FIG. 8 is an illustration of the Knuth algorithm which may be used to encode a binary value into an encoded data word for storage in a row of CAM cells according to the present embodiment. The Knuth algorithm translates a binary value into a balanced data word that can be used as the encoded data word. According to the Knuth algorithm, programmable read/write circuit 241 inverts a number of bits of a binary value to be stored in a row of CAM array 210 until an equal amount of logic low bits and logic high bits are generated, thereby obtaining a balanced data word. As used herein, to "invert" a bit of a binary value is to change the value of the bit to its compliment, e.g., a logic 0 would become a logic 1 and vice-versa. The particular bits of the binary value that are inverted may be selected by starting with the least significant bit of the binary value, and then selecting the next most significant bit, in order, until a balanced word is obtained. Thereafter, programmable read/write circuit 210 (or whatever circuit or software is responsible for translating binary values and encoded data words) adds extra bits to the data word that indicate how many bits of the data word have been inverted. Importantly, the extra bits added must also have zero disparity (an equal number of logic low bits and logic high bits) to ensure that the encoded data word remains balanced.

FIG. 9 is a table 900 that illustrates the compression rate that encoded data words are able to achieve using the Knuth algorithm according to present embodiments, where T is the CAM word width (i.e., the number of XY CAM cells in the row), N is the number of bits with ideal compression, and K is the number of bits using the Knuth algorithm. As shown in table 900, while the Knuth algorithm is slightly less efficient than the idea case depicted by table 400, the Knuth algorithm still yields very attractive compression results and is an easy approach for encoding data words.

Figure 10A:
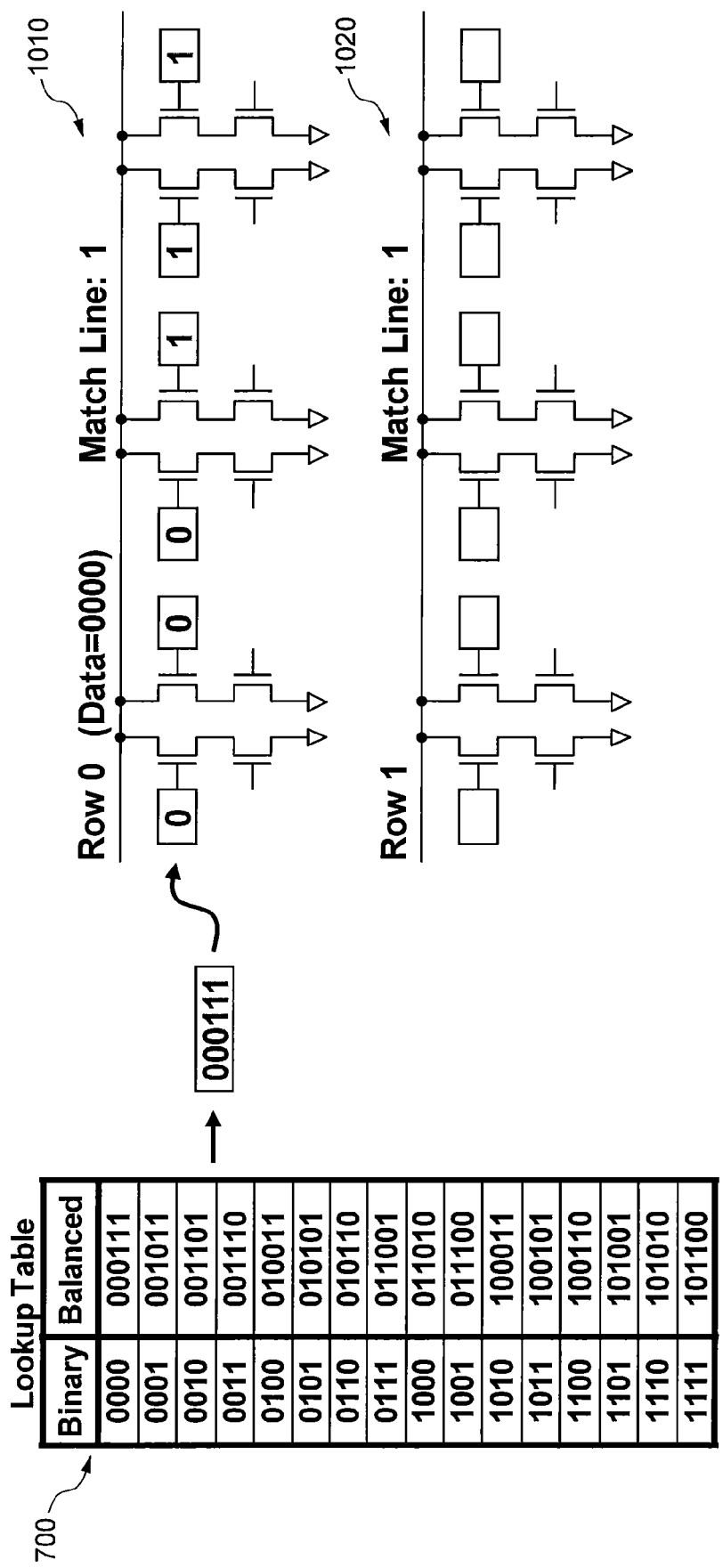
FIGS. 10A and 10B are illustrations of writing encoded data words to illustrative CAM rows according to an embodiment.

FIG. 10A illustrates writing an encoded data word generated in accordance with the present embodiment to XY CAM cells. For simplicity, CAM rows 1010 and 1020 depicted in FIGS. 10A and 10B include only three cells, although in actual practice a CAM row may include any number of CAM cells. To write the binary value "0000" to row 1010 in CAM array 210, programmable read/write circuit 241 first retrieves the corresponding encoded data value from lookup table 700, which provides the encoded data word "000111." Then, programmable read/write circuit 241 writes the encoded data word to CAM row 1010, where as shown in FIG. 10A, each CAM cell of row 1010 stores two bits of the encoded data word 000111.

Figure 10B:
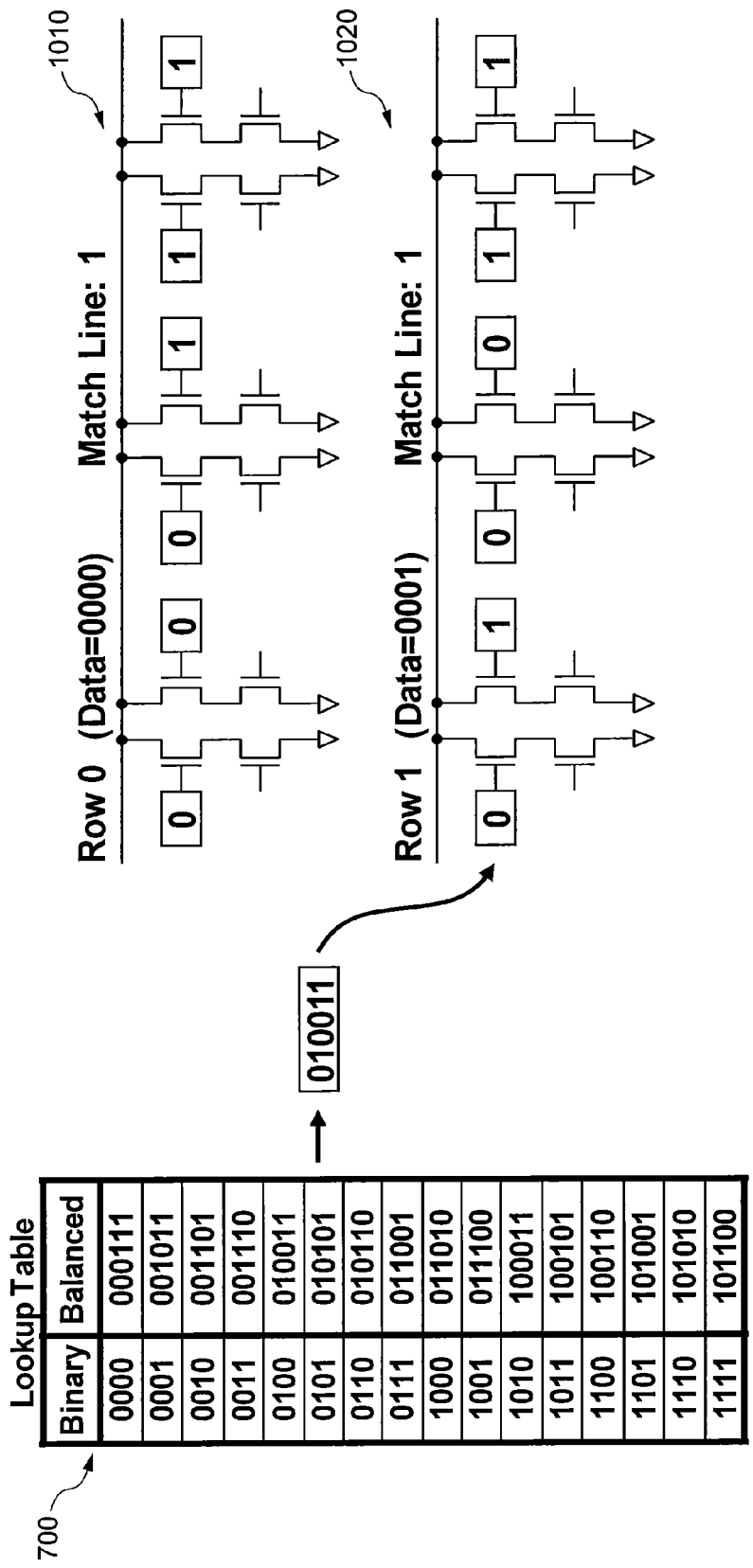

FIG. 10B illustrates writing another encoded data word generated in accordance with the present embodiment to an illustrative CAM row. To write the binary value "0100" to row 1020, programmable read/write circuit 241 retrieves the corresponding encoded data value from lookup table 700, which provides the encoded data word "010011." Then, programmable read/write circuit 241 writes the encoded data word to CAM row 1020, where as shown in FIG. 10B, each CAM cell of row 1020 stores two bits of the encoded data word 010011.

Figure 10C:
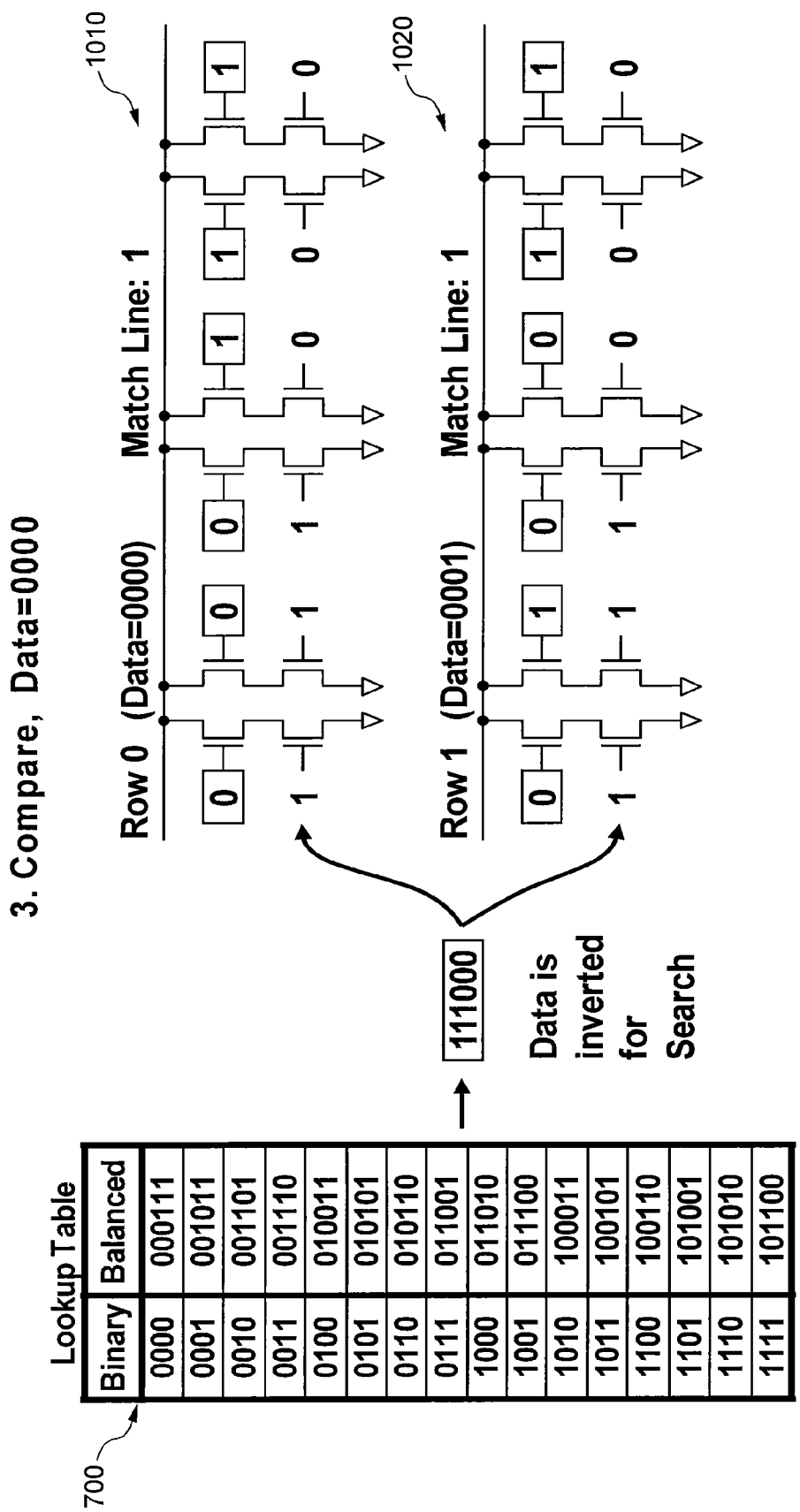
FIG. 10C is an illustration of performing a compare operating on two CAM rows storing encoded data words according to an embodiment.

FIG. 10C illustrates performing a compare operation on CAM rows storing encoded data words according to some embodiments. To compare the binary value "0000" with the encoded data stored in CAM rows 1010 and 1020, programmable read/write circuit 241 retrieves the encoded compare word "000111" from look up table 700.

Then, programmable read/write circuit 241 inverts the encoded compare word to generate an inverted encoded compare word. To illustrate, in FIG. 10C, the encoded compare word is inverted to obtain inverted compare word "111000." In an embodiment where the encoded compare word is a balanced data word, the inverted encoded compare word will be an inverted balanced compare word.

After generating the inverted encoded compare word, the inverted encoded compare word supplied to the CAM rows. For example, as shown in FIG. 10C, the inverted encoded compare word is provided to each of CAM rows 1010 and 1020.

Figure 10D:
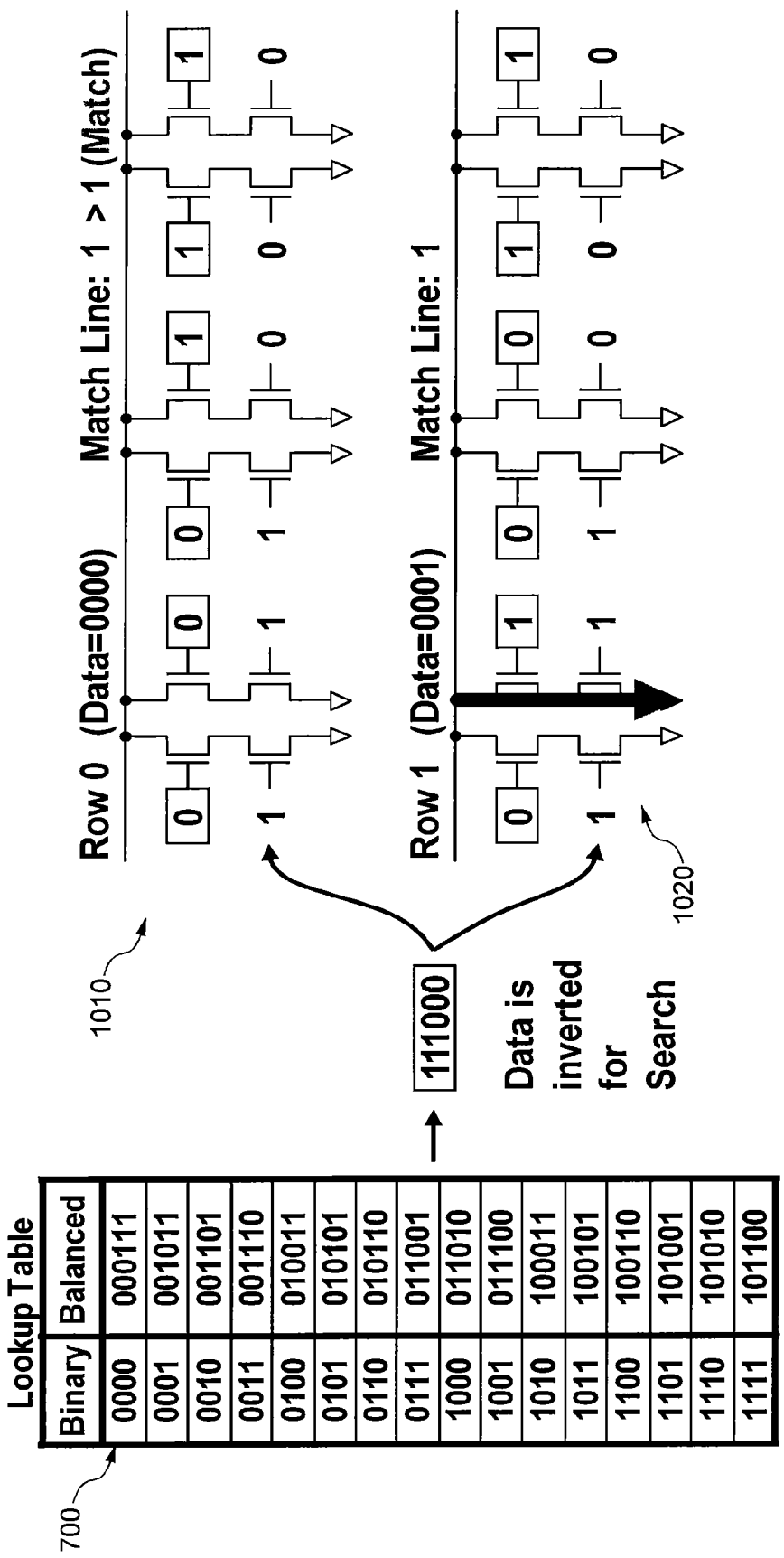
FIG. 10D is an illustration of performing a compare operation on an inverted encoded compare word and two different encoded data words according to an embodiment.

FIG. 10D illustrates performing a compare operation on an inverted encoded compare word and two different encoded data words according to an embodiment. As shown by CAM row 1020 in FIG. 10D, the match line will discharge unless each bit of the encoded data word is the compliment of the inverted encoded compare word stored in the CAM row. This is the reason that the encoded compare word is inverted, namely, to ensure that only a CAM row storing a match of the encoded compare word does not discharge the match line. For example, the match line of CAM row 1010 did not discharge (thus indicating a match) because CAM row 1010 stores an encoded data word "000111" which exactly matches the encoded compare word "000111" (prior to being inverted).

Embodiments may mask data stored in a particular cell of one or more rows, regardless of whether the cell is configured to store one bit of a binary value or two bits of an encoded data word. FIG. 11 illustrates several approaches for implementing a column driver according to present embodiments. Column driver 1110 is a conventional column driver that can drive three states, namely (1) X bit is a logic 0 and Y bit is a logic 0 (indicating a masked state for the cell), (2) X bit is a logic 1 and Y bit is a logic 0 (indicating a logic 0 value for the cell), and (3) X bit is a logic 0 and Y bit is a logic 1 (indicating a logic 1 value for the cell). Column driver 1110 is useful when storing a binary value in a cell using the encoding scheme depicted in table 150. A block mask register (BMR) provides a mask bit (M) to first inputs of the multiplexers.

Column driver 1130 is a balanced code column driver that can independently drive the X and Y bits to facilitate storing two bits into a single CAM cell according to present embodiments. Column driver 1130 is thus able to drive four states, namely (1) X bit is a logic 0 and Y bit is a logic 0, (2) X bit is a logic 1 and Y bit is a logic 0, (3) X bit is a logic 0 and Y bit is a logic 1, and (4) X bit is a logic 1 and Y bit is a logic 1.

Column driver 1150 is a hybrid approach that may be configured to function either as column driver 1110 or as column driver 1130. In this way, column driver 1150 may be used to store either a single bit of a binary value into a CAM cell or store two bits of an encoded data word into the CAM cell. Each of column drivers 1110, 1130, and 1150 may be configured to mask data using a block mask register as shown by FIG. 11.

Individual array blocks with CAM array 210 may be configured to store data in accordance with different encoding schemes, such as the encoding scheme of table 150 of FIG. 1 or the encoding scheme depicted by FIG. 3 (e.g., by storing two bits of an encoded data word in each cell). To illustrate several approaches for implementing array blocks, consider FIG. 12, which is an illustration of several embodiments for implementing array blocks that may selectively store data using different encoding schemes. In CAM array 1210, all the blocks thereof may be configured to operate in accordance with the encoding scheme of FIG. 1 (hereafter a "ternary block") or in accordance with the encoding scheme of FIG. 3 (hereinafter a "compressed block") by adjusting the mode select signal 1212 to the multiplexer coupled to the read/write line to each block. An encoder, such as encoder 1211, is a functional component responsible for encoding a binary value into an encoded data word. An encoder may encode a data word using any scheme and using any approach, such as a lookup table, an algorithm, or a hash table.

In another approach, each block of CAM array 1220 may be separately and independently configured to operate as a ternary block or a compressed block by adjusting a mode select signal (such as mode select signal 1222, 1223, 1224, or 1225) to the multiplexer supplying the read/write line to each block. For example, by adjusting mode select signal 1221, block 0 may be configured to operate as a ternary block or as a compressed block, and by adjusting mode select signal 1225, block 3 may be configured to operate as a ternary block or as a compressed block.

If it is undesirable to duplicate the encoder (e.g., the encoder is too large), then it may be desirable to implement a CAM array as CAM array 1230. In CAM array 1230, each block may be separately and independently configured to operate as a ternary block or a compressed block by adjusting a mode select signal (such as mode select signal 1232, 1233, 1234, or 1235) to the multiplexer supplying the read/write line to each block. For example, in CAM array 1230, blocks 0 and 1 are configured as a ternary block while blocks 2 and 3 are configured as compressed blocks. Advantageously, in CAM array 1230, a single encoder services all blocks of the array, rather than each block having its own encoder.

Figure 12:
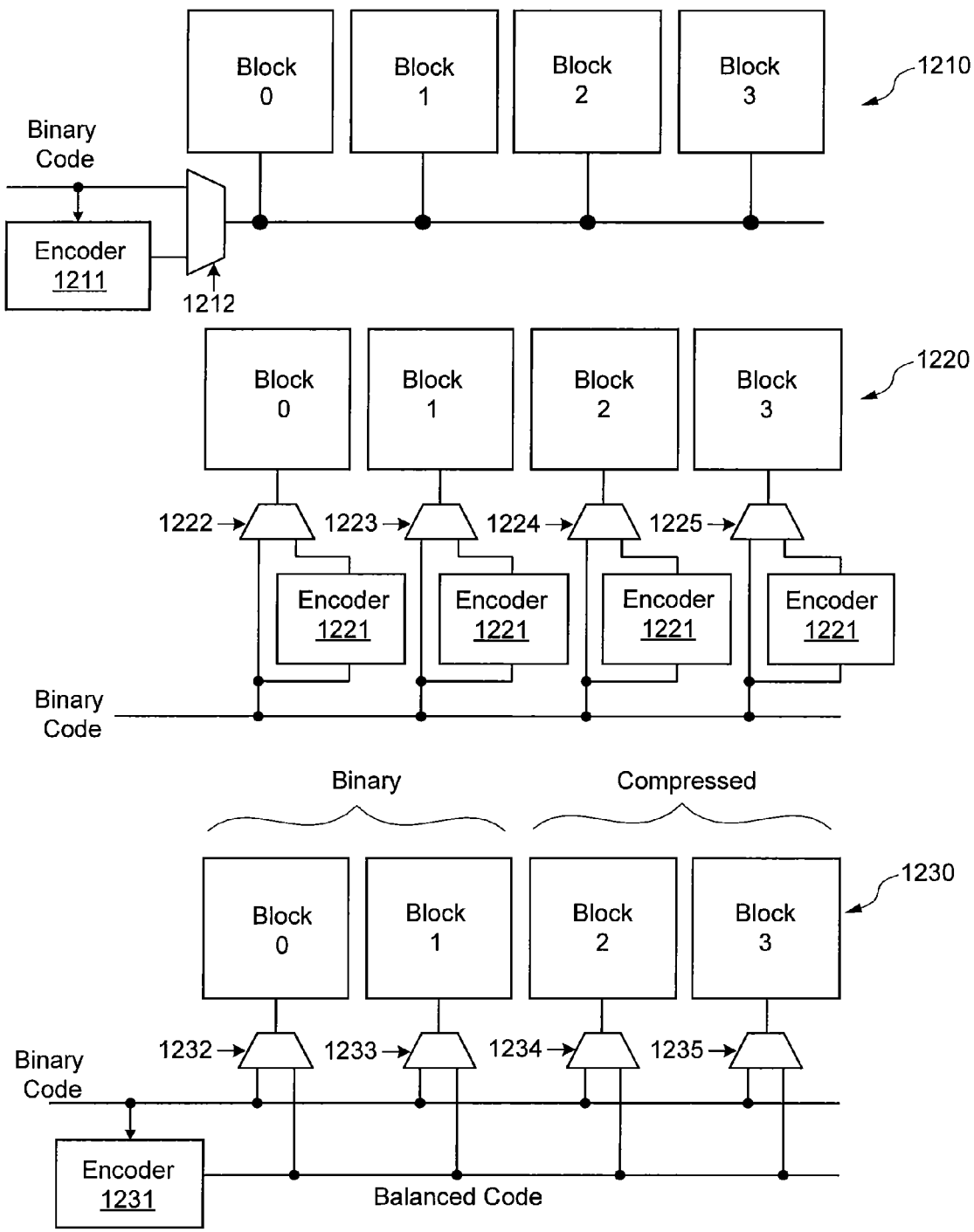
FIG. 12 is an illustration of several approaches for implementing array blocks that may selectively store data using different encoding schemes according to an embodiment.

As shown by FIG. 12, any number of blocks within a CAM array (e.g., a single block up to all blocks of the CAM array) may be configured to operate as a compressed block. The determination as to whether to configure a particular block as a compressed block may be based on a number of factors, including but not limited to area, power, design complexity, and intended use. Compressed blocks may store up to 1.8 times wider data than ternary blocks. Advantageously, a block may be configured to operate as either a ternary block or a compressed block without requiring any changes to be made to software of the CAM device.

Embodiments may have particular utility in the performance of longest prefix matching. Depending on the particular length of the prefix of the IP address, different encoding schemes for a particular CAM row may be used. A compressed encoding scheme is an encoding scheme that uses an encoded data word and involves storing two bits in a single CAM cell, while a ternary encoding scheme is an encoding scheme as shown in table 150.

Figure 13:
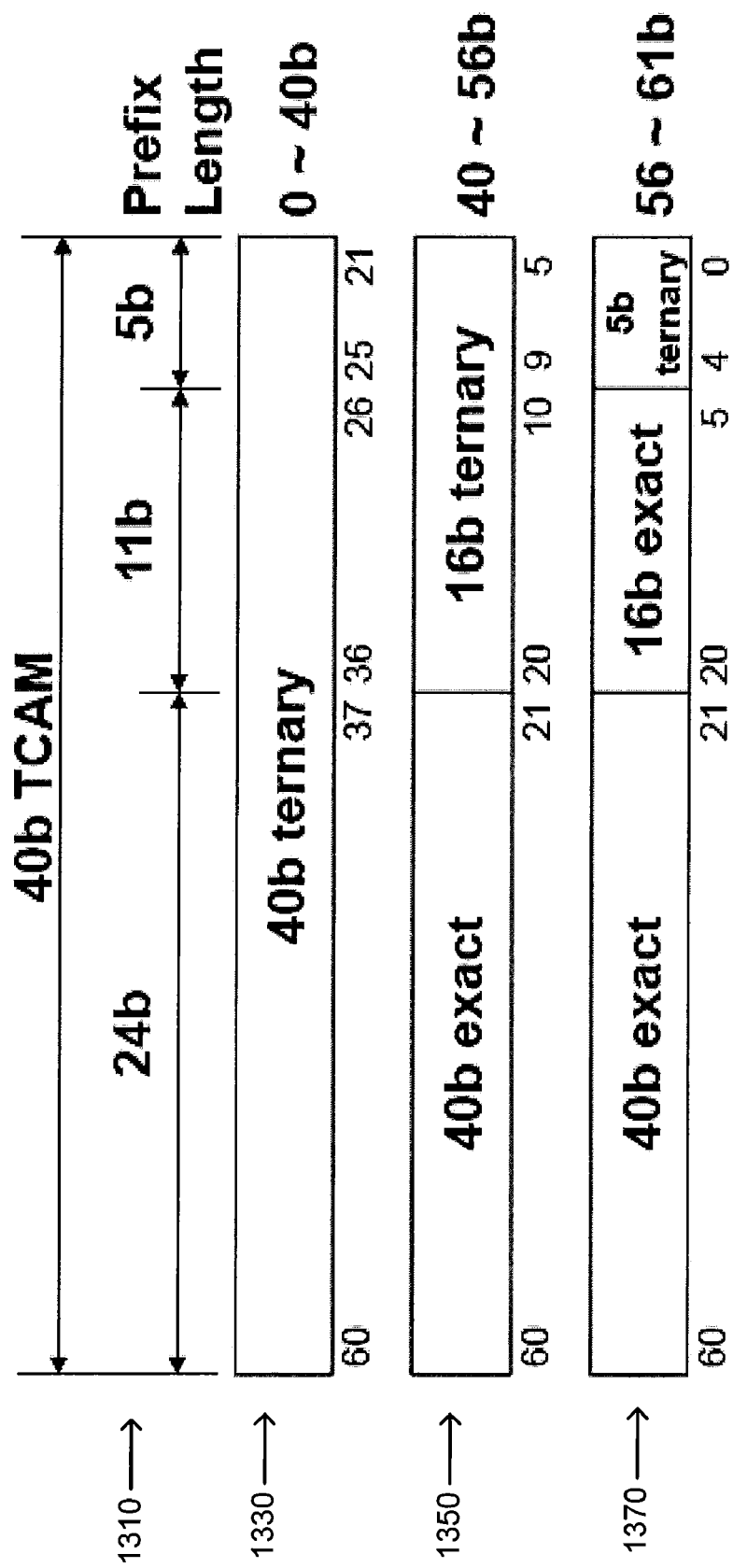
FIG. 13 is an illustration of a CAM row and several illustrative encoding schemes for the CAM row according to an embodiment.

FIG. 13 illustrates CAM row 1310 and several illustrative encoding schemes for CAM row 1310 according to some embodiments. FIG. 13 shows an exemplary 40 cell CAM row 1310 of CAM array 210. For simplicity, CAM row 1310 is depicted as comprising 40 cells; however, CAM row 1310 may comprise any number of cells. CAM row 1310 may be configured to store data according to a variety of different row encoding schemes. Similarly, the particular number of cells which are configured using a ternary encoding scheme or a compressed encoding scheme in each of the row encoding schemes discussed below is exemplary, as other embodiments may implement different row encoding schemes or may implement the row encoding schemes having a different number of cells configured using either a ternary or compressed encoding scheme.

If the length of the prefix of the IP address is between zero and forty bits long, then configuring CAM row 1310 according to row encoding scheme 1330 may be useful in performing the longest prefix operation. In an embodiment, one or more rows of CAM array 210, such as CAM row 1310, may be configured to store data in accordance with row encoding scheme 1330. In row encoding scheme 1330, (a) the entire row is configured to store data in a ternary encoding scheme and (b) the most significant bits of the IP address are stored in the CAM row and any remaining bits are not stored under the rationale that since those bits are masked, it is not necessary to store them. In this approach, any number of least significant bits (LSBs) may be masked as they are not stored by this approach. Thus, if row 1310 were configured to store data according to row encoding scheme 1330, then the row would store 40 bits of data, and any number of bits beyond the 40 most significant would not be stored in the row.

If the length of the prefix of the IP address is between forty and fifty six bits long, then configuring CAM row 1310 according to row encoding scheme 1350 may be useful in performing the longest prefix operation. According to row encoding scheme 1350, a first portion of a row stores data in a compressed encoding scheme, and a second portion stores data in a ternary encoding scheme. In the example depicted in FIG. 13, the first portion of row encoding scheme 1350 is twenty four bits long. In this portion, the first forty most significant bits are compressed into 48 bits of encoded data words that are written into the first twenty four bits of the row. No masking is used in this portion.

As shown in FIG. 13, the second portion of row encoding scheme 1350 is a ternary encoding scheme that is sixteen bits long. In this ternary portion, data may be masked using conventional techniques for masking as illustrated by table 150.

If the length of the prefix of the IP address is between fifty six and sixty one bits long, then configuring CAM row 1310 according to row encoding scheme 1370 may be useful in performing the longest prefix operation. As depicted in FIG. 13, row encoding scheme 1370 comprises three portions. The first and second portions are configured to store data using a compressed encoding scheme. The first portion is twenty four bits long. In this portion, the first forty most significant bits are compressed into 48 bits of encoded data words that are written into the first twenty four bits of the row. No masking is used in this portion.

The second portion of row encoding scheme 1370 is eleven bits long. In this portion, the twenty two bits are compressed into eleven bits of encoded data words that are written into this portion of the row. No masking is used in this portion.

The third and last portion of row encoding scheme 1370 is five bits long and is configured to store data in a ternary encoding scheme. Thus, in this portion, data may be masked using conventional techniques for masking as illustrated by table 150 in FIG. 1B.

The above discussion of row encoding schemes 1330, 1350, and 1370 illustrate how present embodiments may store, within a single row, data in accordance with a compressed encoding scheme as well as a ternary scheme. Row encoding schemes 1330, 1350, and 1370 are merely illustrative of the types of row encoding schemes which may be used by present embodiments. Other embodiments may employ other types of row encoding schemes that differ than those discussed above to more particularly suit the particular type of data which the CAM device stores or operates on. Row encoding schemes may even comprise a plurality of portions that contain two or more separate portions that store data in a compressed encoding scheme or a ternary encoding scheme.

While read/write circuit 240 has chiefly been described as being configured to selectively store, within each CAM cell of each CAM row, either a single bit of a binary value or two bits of an encoded data word encoded from the data word, in other embodiments, read/write circuit 240 may be implemented such that read/write circuit 240 always stores two bits of an encoded data word within each CAM cell of CAM array 210.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device, comprising:
    a CAM array including a plurality of rows, each row including a number T of quaternary CAM cells coupled to a match line; and
    a programmable write circuit coupled to the CAM array and configured to selectively store, within each CAM cell of a selected CAM row, either a single data bit of a first data word or two data bits of an encoded data word, wherein none of the data bits are mask bits, wherein the first data word includes T data bits that represent up to $2^T$ possible states, and the encoded data word includes 2T data bits that represent up to $S=(2T)!/(T!)^2$ possible states, wherein T is an integer greater than 2.

2. The CAM device of claim 1, wherein the programmable write circuit comprises:
    a data encoder circuit having an input to receive the first data word, and having an output to generate the encoded data word; and
    a plurality of write drivers having inputs configured to receive either the first data word or the encoded data word, and having outputs coupled to the CAM array.

3. The CAM device of claim 1, wherein the programmable write circuit comprises a lookup table storing a mapping between the first data word and the encoded data word.

4. The CAM device of claim 1, wherein the programmable write circuit further comprises a control input to receive an encoding select signal that selects an encoding scheme to generate the encoded data word.

5. The CAM device of claim 4, further comprising:
    a programmable comparand register having an input to receive a search key, having a control input to receive the encoding select signal, and having an output to provide an encoded search key to the CAM array for compare operations.

6. The CAM device of claim 1, wherein the encoded data word comprises a balanced data word that has an equal number of logic high bits and logic low bits.

7. The CAM device of claim 6, wherein the encoded data word is generated using a hashing function.

8. The CAM device of claim 6, wherein the encoded data word is generated by inverting a number of bits of the data word until an equal amount of logic low bits and logic high bits are obtained and adding extra bits to the data word that indicate how many bits of the data word have been inverted.

9. A content addressable memory (CAM) device, comprising:
    a CAM array including a plurality of rows, each row including a number T of quaternary CAM cells; and
    a programmable write circuit coupled to the CAM array and configured to store, within a selected row, a single data bit of a first data word in each of a first set of CAM cells in the selected row, and two data bits of an encoded data word in each of a second set of CAM cells in the selected row, wherein none of the data bits are mask bits, wherein the first data word includes a number N of data bits stored in N CAM cells and represents up to $2^N$ possible states, and the encoded data word includes a number 2M of data bits stored in M CAM cells and represents up to $S=(2M)!/(M!)^2$ possible states, wherein N and M are integers greater than or equal to 2, and N+M=T.

10. The CAM device of claim 9, wherein the encoded data word comprises a balanced data word that has an equal number of logic high bits and logic low bits.

11. The CAM device of claim 10, wherein the encoded data word is generated by inverting a number of bits of the data word until an equal amount of logic low bits and logic high bits are obtained and adding extra bits to the data word that indicate how many bits of the data word have been inverted.

12. The CAM device of claim 9, wherein the programmable write circuit comprises:
   a data encoder circuit having an input to receive the first data word, and having an output to generate the encoded data word; and
   a plurality of write drivers each having inputs configured to receive either data bits of the first data word or data bits of the encoded data word, and having outputs coupled to the CAM array.

13. The CAM device of claim 9, wherein the programmable write circuit comprises a lookup table storing a mapping between the first data word and the encoded data word.

14. The CAM device of claim 9, wherein the programmable write circuit further comprises a control input to receive an encoding select signal that selects an encoding scheme to generate the encoded data word.

15. The CAM device of claim 14, further comprising:
   a programmable comparand register having an input to receive a search key, having a control input to receive the encoding select signal, and having an output to provide an encoded search key to the CAM array for compare operations.

16. The CAM device of claim 9, further comprising:
   a programmable read circuit coupled to the CAM array and configured to selectively decode a selected encoded data word read from the CAM array into its corresponding first data word.

17. A content addressable memory (CAM) device including a plurality of CAM blocks, each CAM block comprising:
   a CAM array including a plurality of rows, each row including a number T of quaternary CAM cells; and
   a programmable write circuit coupled to the CAM array in the corresponding block and configured to store, in each CAM cell within a selected row of the CAM array, either a single data bit of a first data word or two data bits of an encoded data word, wherein the programmable write circuit comprises:
   a data encoder circuit having an input to receive the first data word and configured to generate the encoded data word; and
   a multiplexer having a first input to receive the first data word, having a second input to receive the encoded data word, having a control input to receive a mode select signal, and having an output coupled to the CAM array;
   wherein the first data word includes T data bits that represent up to $2^T$ possible states, and the encoded data word includes 2T data bits that represent up to $S=(2T)!/(T!)^2$ possible states, and wherein T is an integer than 2.

18. The CAM device of claim 17, wherein a first of the programmable write circuits is configured to store a number of the first data words in the CAM array of a first of the CAM blocks, and a second of the programmable write circuits is configured to store a number of the encoded data words in the CAM array of a second of the CAM blocks.

19. The CAM device of claim 17, wherein none of the data bits are mask bits.

20. The CAM device of claim 17, wherein each programmable write circuit comprises a lookup table storing a mapping between the first data word and the encoded data word.

21. The CAM device of claim 17, wherein the encoded data word comprises a balanced data word that has an equal number of logic high bits and logic low bits.

22. The CAM device of claim 21, wherein the encoded data word is generated using a hashing function.

23. The CAM device of claim 21, wherein the encoded data word is generated by inverting a number of bits of the data word until an equal amount of logic low bits and logic high bits are obtained and adding extra bits to the data word that indicate how many bits of the data word have been inverted.

24. The CAM device of claim 17, wherein the programmable write circuit further comprises a control input to receive an encoding select signal that selects one of a plurality of encoding schemes to generate the encoded data word.

25. The CAM device of claim 24, further comprising:
   a programmable comparand register having an input to receive a search key, having a control input to receive the encoding select signal, and having an output to provide an encoded search key to the CAM array for compare operations.

* * * * *